United States Patent [19]

Nishiura et al.

[11] Patent Number: 4,999,308

[45] Date of Patent: Mar. 12, 1991

[54] METHOD OF MAKING THIN FILM SOLAR CELL ARRAY

[75] Inventors: Masaharu Nishiura; Katsumi Yamada, both of Kanagawa, Japan

[73] Assignee: Fuji Electric Co., Ltd., Kanagawa, Japan

[21] Appl. No.: 422,608

[22] Filed: Oct. 17, 1989

Related U.S. Application Data

[62] Division of Ser. No. 268,904, Nov. 8, 1988.

[30] Foreign Application Priority Data

Nov. 9, 1987 [JP] Japan .................................. 62-282801
Dec. 22, 1987 [JP] Japan .................................. 62-326232
Dec. 28, 1987 [JP] Japan .................................. 62-332372

[51] Int. Cl.$^5$ .............................................. H01L 31/20
[52] U.S. Cl. .......................................... 437/4; 437/51; 437/173; 437/205
[58] Field of Search ...................... 437/4, 51, 64, 173, 437/205; 136/244, 249 MS

[56] References Cited

U.S. PATENT DOCUMENTS

| | | | |
|---|---|---|---|
| 4,517,403 | 5/1985 | Morel et al. | 136/249 MS |
| 4,570,332 | 2/1986 | Yamauchi | 437/170 |
| 4,675,467 | 6/1987 | Van Dine et al. | 136/249 MS |
| 4,734,379 | 3/1988 | Kamiyama | 437/2 |

Primary Examiner—Aaron Weisstuch
Attorney, Agent, or Firm—Finnegan, Henderson, Farabow, Garrett, and Dunner

[57] ABSTRACT

The present invention pertains to a thin film solar cell array that has an increased durability to high temperatures and high humidity. The thin film solar cell includes a transparent insulating substrate on which unit cells are placed in series. The rear electrodes of the unit cells are made of paste material containing conductive particles which may be applied by printing and baking at about 150° C. Further, the present invention achieves low contact resistance to the a-Si layer.

2 Claims, 2 Drawing Sheets

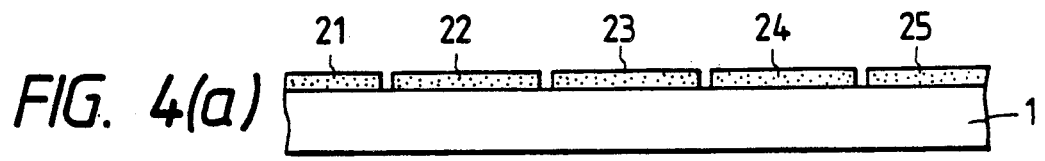
FIG. 4(a)
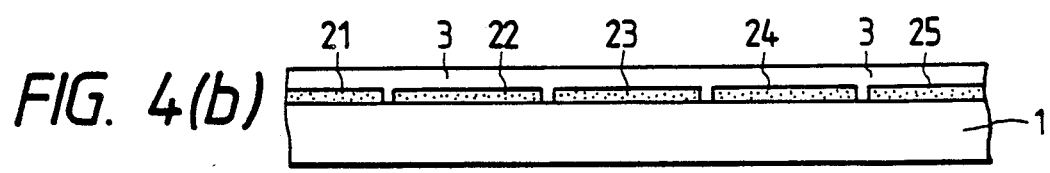
FIG. 4(b)
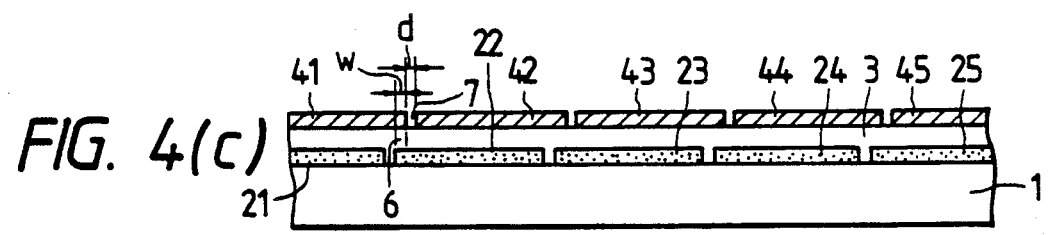
FIG. 4(c)
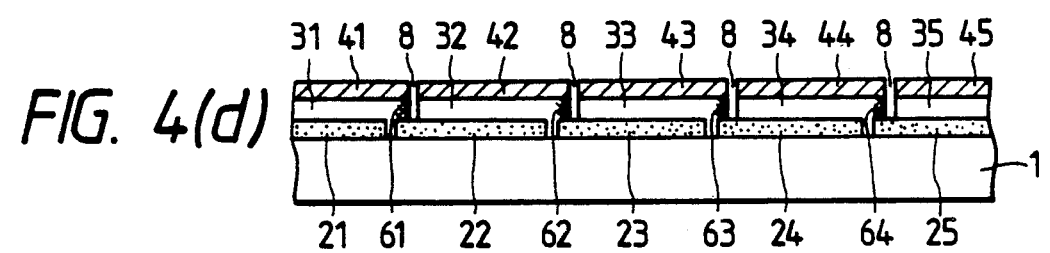
FIG. 4(d)
FIG. 5
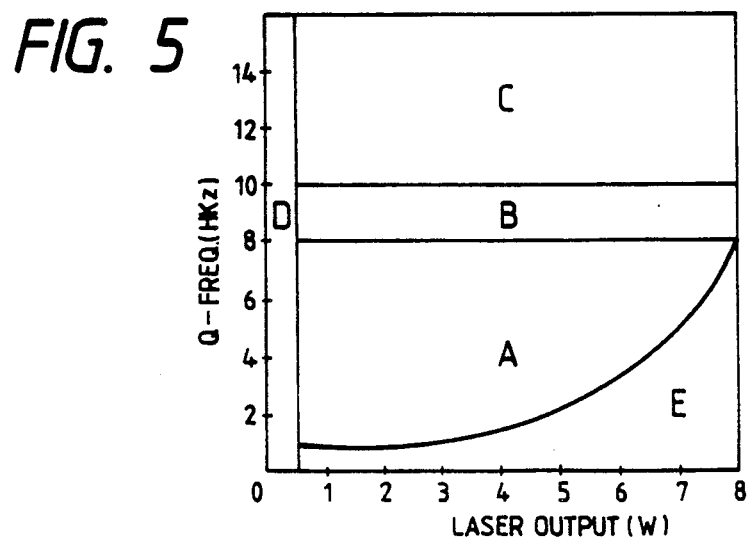

METHOD OF MAKING THIN FILM SOLAR CELL ARRAY

This is a division of application Ser. No. 07/268,904, filed Nov. 8, 1988.

FIELD OF THE INVENTION

The present invention relates to a low cost thin film solar cell array made from unit cells which have a junction structure for photovoltaic conversion formed by use of amorphous silicon, and a electrode formed by printing.

BACKGROUND OF THE INVENTION

Conventional thin film solar cell arrays which utilize amorphous silicon (hereinafter referred to as "a-Si") have a plurality of unit cells connected in series for the purpose of increasing the output voltage. Generally, each unit cell is composed of: a transparent electrode formed of ITO (indium-tin oxide) or $SnO_2$ and arranged on a transparent insulating substrate, such as a glass substrate; an a-Si layer, having a p-i-n junction structure, and being composed of an approximately 200 Å thick p-type layer formed by glow-discharge decomposition of a gas mixture of silane, hydrocarbon such as acetylene, and diborane, an approximately 0.5 μm thick non-doped layer, formed by glow-discharge decomposition of silane gas, and, an approximately 500 Å thick n-type layer, formed by glow-discharge decomposition of a gas mixture of silane and phosphine; and, a rear electrode formed of an approximately 1 μm thick metal thin film.

The conventional series connection is established as follows. First, a transparent electrode film, an a-Si film and a rear electrode film are successively formed on one and the same transparent insulating substrate. The whole surface of the substrate is covered with the respective films. After each respective layer deposition, the respective film is patterned to separate unit cells and to form connection portions between adjacent cells. More specifically, after the transparent electrode film is formed by electron beam evaporation or sputtering, the patterning of the transparent electrodes is made by a printing method or photolithography in which a resist pattern is formed by exposure using a photomask for etching treatment. The patterning of the a-Si film is made by a photolithography or laser-scribing method. The metal rear electrode film is formed by electron beam evaporation or sputtering method and is patterned by photolithography.

Conventionally, an expensive apparatus for evaporation or sputtering is used. Additionally, photolithographic techniques are used to form the rear electrodes of a thin metal film. Accordingly, it is difficult to reduce the number of manufacturing steps. Typically, in order to reduce the manufacturing costs, printing of the rear electrodes has been suggested as a means to make it possible to perform simultaneously the film forming process and the patterning process.

In the case of a crystalline Si solar cell or a polycrystalline Si solar cell, the electrodes can be formed by coating the Si layer with a paste. The paste may be prepared by mixing Ag particles in epoxy resin and baking the paste at 600–700° C. so that electrodes which come into electrical contact with the Si layer are formed. FIG. 2, curve 10, demonstrates the result where this technique is applied to an a-Si solar cell, using an illuminance of 200 lx. The fill factor is not larger than 0.4. FIG. 2, curve 20, illustrates the characteristic of a solar cell for an incident energy of 100 $mW/cm^2$. Heating of the a-Si solar cell to 200 ° C. or more is impossible. Therefore, sintering, due to vaporizing of a high molecular weight resin, cannot be performed and a sufficiently low contact resistance cannot be secured. Finally, conventional printed electrodes suffer from poor resistance to humidity.

SUMMARY OF THE INVENTION

An object of the present invention is to overcome the problems and disadvantages of the prior art.

Another object of the present invention is a thin film solar cell in which the printed electrodes are formed by baking at about 150° C.

Another object of the present invention is a thin film solar cell having a sufficiently low contact resistance to the a-Si layer.

A further object of the present invention is a thin film solar cell having increased durability to high temperatures and high humidity such that the printed electrodes can serve as rear electrodes.

To achieve the above objects and in accordance with the purpose of the invention, as embodied and broadly described herein, the invention comprises a thin film solar cell array including a transparent insulating substrate. Unit cells are arranged on the transparent insulating substrate and are connected in series. Each unit cell is composed of a transparent electrode, an amorphous silicon layer with a junction structure, and, a rear electrode. The unit cells are formed by utilizing selected resins, containing nickel particles as an electrical conductor and mulled with a silicon coupling agent. Other resins containing carbon particles as an electrical conductor and mulled with a silicon coupling agent are also used. Thereafter, the resins may be singly printed and baked. Alternatively, the two resins can be printed one over the other and then baked.

Low contact resistance to the a-Si layer can be achieved by printing the rear electrode with a material obtained by adding a silicon coupling agent to a resin containing one member selected from the group of amorphous carbon particles, graphite particles and nickel particles and then baking such at about 150° C. In this way, the rear electrode attains the characteristics of a large fill factor and excellent stability.

In an alternative embodiment, the rear electrode comprises first and second resin layers. The first resin layer contains electrically conductive nickel particles and a silicon coupling agent mulled therein. The second resin layer, covering the first resin layer, contains electrically conductive amorphous carbon or graphite particles and a silicon coupling agent mulled therein. The rear electrode according to this embodiment provides a stable electrical contact to the a-Si layer.

BRIEF DESCRIPTION OF THE DRAWINGS

The accompanying drawings, which are incorporated in and constitute a part of this specification, illustrate several embodiments of the present invention and together with the description, serve to explain the principles of the present invention.

FIGS. 4(a) through 4(d) show sectional views of a flow chart of a process for producing an additional embodiment of the solar cell array of the present invention; and, FIG. 5 shows a graph of the laser output vs. the frequency of a laser patterning process of the present invention in a machining mode.

DETAILED DESCRIPTION OF THE PREFERRED EMBODIMENTS

Figure 1:
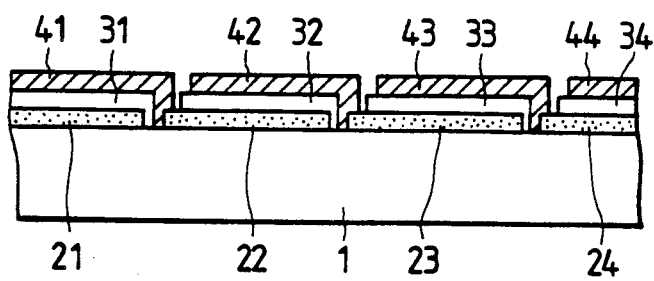
FIG. 1 shows a sectional view of an embodiment of the solar cell array of the present invention.

Referring to FIG. 1, a film of ITO (indium-tin oxide) or $SnO_2$ (tin oxide) is formed on a glass substrate 1 by electron beam evaporation or sputtering. Transparent electrodes 21, 22, 23, 24. . . are patterned by photolithography. An a-Si layer having a p-i-n junction structure is formed in the same manner as described above. Patterns 31, 32, 33, 34. . . are formed by photolithography so that one end of each pattern covers a part of the corresponding space between adjacent transparent electrodes 21, 22, 23, 24. . . Further, patters of metal electrodes 41, 42, 43, 44. . . are formed by a printing method using phenol resin containing nickel particles as a filler.

Figure 3:
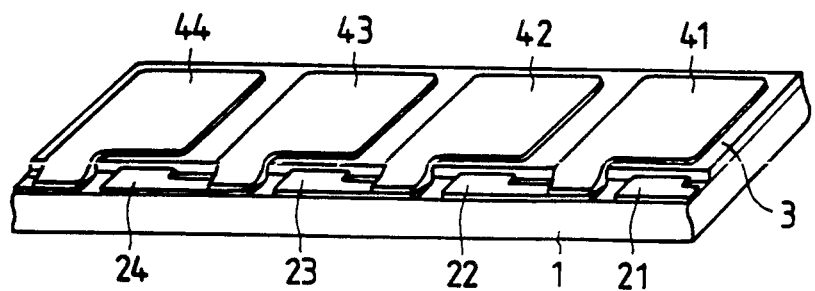
FIG. 3 shows a perspective view of another embodiment of the solar cell array of the present invention.

FIG. 3 shows a thin film solar cell array having a structure different from that of FIG. 1. In FIG. 3, a-Si layer 3 is continuous so that it is not separated by unit cells. Connection of the unit cells is made by overlapping extensions or end portions of rear electrodes 41, 42, 43, 44. . . with extensions or end portions of transparent electrodes 22, 23, 24, 25. . . which are located off to one side with respect to the direction of arrangement of the cells. Also the printed metal electrodes in the solar cell array having the aforementioned structure can serve as rear electrodes 41, 42, 43, 44. . . .

FIGS. 4(a) through 4(d) show the process of producing a solar cell array according to the present invention. The reference numerals uniformly represent similar elements in each of FIGS. 1 and 4(a–d). As shown in FIG. 4(a), a transparent electrically conductive film of $SnO_2$ with the thickness of 1000–3000 Å is formed on a glass substrate 1 by sputtering. Transparent electrodes 21–25 are formed by a beam of a YAG laser light with a wavelength of about 1.06 $\mu m$ and a spot diameter of 60 $\mu m$. As shown in FIG. 4(b), an approximately 1 $\mu m$ thick a-Si layer 3, having a p-i-n junction structure, is formed by plasma CVD as described above with reference to FIG. 1. As shown in FIG. 4(c), metal electrode patterns 41, 42, 43, 44, 45. . . are applied and hardened by the aforementioned printing method. The width "w" of each of the overlapping portions 6 of the metal electrodes 41, 42, 43, 44 with the respective transparent electrodes 22, 23, 24, 25 is 30 $\mu m$. The distance "d" between adjacent metal electrodes (spaces 7) is approximately 50 $\mu m$.

From the side of the glass substrate 1, YAG laser light with a wavelength of 0.53 $\mu m$ and a spot diameter of about 50–80 $\mu m$ is focused on the overlapping portions 6 where the metal electrodes overlap with the transparent electrodes. The irradiation of the light spot is carried out while the center point of the light spot is moved along the spaces between the side end surfaces of the adjacent metal electrodes 41, 42, 43, 44, 45. . . As a result, the a-Si layer 3 is cut at the lower portions 8 of the spaces 7 between adjacent metal electrodes. Accordingly, the a-Si layer 3 is separated into segments, 31, 32, 33, 34, 35. . . Connection areas 61, 62, 63, 64. . . for connecting the opposite electrodes to each other are made from overlapping portions 6 which are finely crystallized where they contact the cut portions 8.

As shown in FIG. 5, the patterning and crystallization with laser light can be made when the laser output is within the region A of the machining mode. When the Q-frequency is less than or equal to 3 kHz, the printed metal electrodes are often injured. Therefore, it is necessary to keep the frequency of the laser light between 3 kHz and 8 kHz. Further, it is necessary to adjust the spot diameter so that adjacent metal electrodes are not affected by a large laser spot.

According to the present invention, an electrically conductive filler, such as Ni or carbon particles, is mixed in a resin such as a phenol resin, melamine-alkyd resin, or the like. The resin is printed on a surface to which a silicon coupling agent has been previously applied. Alternatively, resin mulled with such a silicon coupling agent may be printed on a surface. As a result, printed rear electrodes, capable of contacting the a-Si layers with low resistance, can be prepared by baking the resin at low temperatures. Accordingly, a low-cost solar cell having a large fill factor and good durability against heat and humidity can be prepared. Further, by adding graphite particles to amorphous carbon particles or by adding an oxide of Sn, such as ITO and $SnO_2$, and by regulating the respective particle sizes, characteristics including the stability of the solar cell array can be improved.

Further, deterioration of the solar cell array can be prevented without the application of protective films by disposing two resins one over the other. The resins are selected from phenol resin, melamine alkyd resin, or the like. One of the resins contains nickel particles as an electrically conductive filler and is mulled with a silicon coupling agent. The other resin contains carbon particles as an electrical conductor and is mulled with a silicon coupling agent. Further, by addition of an additive, such as ITO and $SnO_2$, to the two resin layers, the characteristics of the solar cell array are improved.

The First Embodiment

Figure 2:
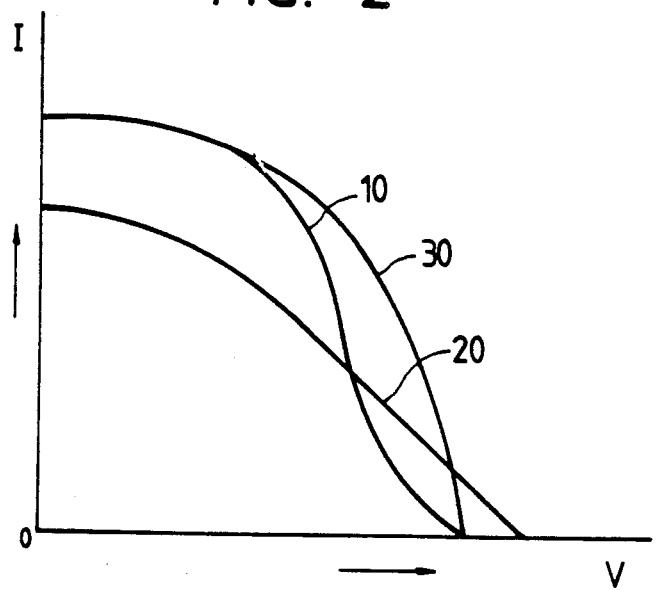
FIG. 2 shows an output characteristic graph of an embodiment of the solar cell array of the present invention and a conventional solar cell.

The initial characteristics of the thin film solar cell of the first embodiment is shown in FIG. 2 as curve 30. The initial fill factor of the thin film solar cell was 0.60. The test results wherein the solar cell was left in high-temperature and high-humidity conditions of 60° C. and 90%, respectively, show that the solar cell had a fill factor which was lowered to about 0.50 after 40 hours and recovered to approximately 0.55 after about 500 hours.

The phenol resin used for the first embodiment was prepared via the reaction of phenol, formalin, rosin and oil and the esterification thereof with glycerol. The particle size of the nickel particles used was adjusted to be 1 to 10 ⌃mm by a ball mill or the like. The nickel particles were mixed in the phenol resin in the proportion of 1–5 parts by weight of nickel particles per one part of the resin. The surfaces of a-Si layers 31, 32, 33, 34. . . were soaked in a silicon coupling agent, such as ⌃q-aminopropyltriethoxysilane (tradename: TSL8331, TOSHIBA SILICONE CO, Co., Ltd.), N-( ⌃b-aminoethyl)- ⌃q-aminopropyl-triethoxysilane (tradename: TSL8340, TOSHIBA SILICONE CO., Ltd.), ⌃q-glycidoxypropyltriethoxysilane (tradename: TSL8350, TOSHIBA SILICONE Co., Ltd.).

The surfaces were then dried and baked. The viscosity of the phenol resin containing nickel particles was adjusted by use of an ethylene glycol series or diethylene glycol series solvent. The patterns of rear electrodes 41, 42, 43, 44... were printed with the phenol resin by use of a screen mask having a mesh size of 120–180 so that one end of each rear electrode covered a part of a corresponding space between adjacent a-Si layers 31, 32, 33, 34... and touched an end portion of the next-cell transparent electrode 22, 23, 24, 25.... The patterns were hardened at 120–189° C. for 20–60 minutes.

The Second Embodiment

The initial fill factor of the thin film solar cell of the second embodiment was 0.61. The solar cell was left in the high-temperature and high-humidity conditions of 60° C. and 90%, respectively. As a result, the fill factor of the solar cell was 0.60 after about 500 hours or in other words the fill factor was lowered by about 2%. The particle size of Ni after the roll dispersion was 3 to 20 ˄mm. The results indicate that if the particle size was 5 to 15 ˄mm, the fill factor would be improved by about 0.01. In short, it was found that the preferred particle size was within a range between about 30% of the film thickness and about two times the film thickness. The more preferred particle size was a range between 0.5 times and 1.5 times the film thickness.

In the second embodiment, printed rear electrodes were prepared as follows. The particle size of nickel particles was adjusted to 5 to 10 ˄mm by a ball mill or the like. The nickel particles were mixed in phenol resin, as defined in the first embodiment, in the proportion of 1–5 parts by weight of nickel particles per one part of the resin. Then 0.1–5% by weight of a silicon coupling agent was added to the resin. The viscosity of the resulting resin was adjusted to 100–400 poise by use of a solvent as defined in the first embodiment. The particle size was adjusted by roll dispersion treatment in which the resin was passed between the rolls. The resin was applied to form a 10–20 ˄mm thick film by use of a screen mask of 180–250 mesh size. The film was hardened at 120–180° C. for 20–60 minutes.

The Third Embodiment

The initial fill factor of the thin film solar cell of the third embodiment was 0.61. The test in which the solar cell was left in high-temperature and high-humidity conditions of 60° C. and 90%, respectively, showed very little change in the fill factor after 500 hours.

In the third embodiment, a mixture of phenol resin, as defined in the first embodiment, and alkyd resin in the proportion 4:6 was used as the resin. The alkyd resin used was prepared by adding drying oil, such as linseed oil, tung oil, soybean oil or the like, dehydrated castor oil or constituent fatty acid thereof to a series of phthalic anhydride and glycerol. Other treatments, such as roll dispersion treatment, were made in accordance with the second embodiment.

The Fourth Embodiment

The initial fill factor of the thin film solar cell of the fourth embodiment was 0.59. The test results wherein the solar cell was left in high-temperature and high-humidity conditions of 60° C. and 90%, respectively, indicated that the fill factor was lowered to 0.57 after 500 hours, i.e., the fill factor hardly deteriorated.

The fourth embodiment involved a solar cell, produced in the same manner as the third embodiment, except that a mixture of the phenol-modified alkyd resin, as defined in the third embodiment, and epoxy resin were used. The epoxy resin used, for example, was prepared by interacting epichlorhydrin to bisphenol A made from phenol and acetone.

When the solar cell was produced in the same manner except that ITO particles divided into 3 $\mu$m segments were added in the proportion of 20–60% to the Ni filler of the resin, the initial fill factor produced was 0.61. The results of the test in which the solar cell was left in high-temperature and high-humidity conditions of 60° C. and 90%, respectively, showed the fill factor was 0.58 after 500 hours.

When the solar cell wa produced in the same manner with the exception that the ITO particles, which were used as a filling material, were replaced by $SnO_2$ particles, there were no characteristic differences in the solar cell.

The Fifth Embodiment

The initial fill factor of the thin film solar cell of the fifth embodiment was 0.60. The results of the test in which the solar cell was left in high-temperature and high-humidity conditions of 60° C. and 90%, respectively, indicated that the fill factor of the solar cell barely changed after 500 hours.

In the fifth embodiment, a mixture of 4–6 moles of formaldehyde and butanol were added to 1 mole of melamine. While the pH value of the resulting mixture was adjusted to 6–8 by addition of ammonia, a methylolizing reaction was conducted at 90–100° C. for 30 minutes. Thereafter, a small quantity of butyl phosphate was added to cause a butyletherification reaction for about an hour. The pH values were adjusted to 4–5. Xylol was added to remove generated water and butanol. The product was diluted with a solvent selected from xylol, butanol and a mixture thereof to prepare a melamine resin solution. Further, 30–45% of short-oil-length alkyd resin was mixed with the melamine resin. The short-oil-length alkyd resin was prepared by adding drying oil, such as linseed oil, tung oil, soybean oil and the like, dehydrated castor oil or constituent fatty acid to a series of phthalic anhydride and glycerol.

Nickel particles, divided into 10 $\mu$m, were mixed in the melamine-alkyd resin. Then, 0.1–5% by weight of a silicon coupling agent was added. After roll dispersion treatment, the resin was applied to form a 10–20 $\mu$m thick film by use of a screen mask of 180–250 mesh size.

In the case where a solar cell was produced in the same manner as described above with the exception that ITO or $SnO_2$ particles were added to the Ni filler of the resin, the initial fill factor of the solar cell slightly improved to 0.61.

Where the metal electrodes were printed by baking at 150 ° C. for 60 minutes using the same material as in the second embodiment, the fill factor of the thin film solar cell produced was not less than 0.65 under irradiation conditions of 10 mW/cm$^2$ and 100mW/cm$^2$. Where the Ni particle size was regulated at 5 to 10 $\mu$m by the roll dispersion treatment, the fill factor slightly improved to 0.67. The deterioration of the fill factor as a result of the test in which the solar cell was left in high-temperature and high-humidity conditions of 60° C. and 90%, respectively, was no more than 3–5%. The process of positioning the a-Si layer patterns was not required. Accordingly, spaces for the positioning process were not required. Consequently, in the case where the unit cells were arranged at pitches of 5 mm, the width of an ineffective portion between adjacent elements was reduced from 250 $\mu$m to 150 $\mu$m to improve the effective area ratio to 91%.

The Sixth Embodiment

The characteristic of the thin film solar cell of the sixth embodiment is shown in FIG. 2 at curve 30. The initial fill factor of the thin film solar cell was 0.60. The test results wherein the solar cell was left in high-temperature and high-humidity conditions of 60° C. and 90%, respectively, indicated that the solar cell fill factor was lowered to approximately 0.50 after about 40 hours but recovered to approximately 0.55 after 500 hours.

The sixth embodiment involves the use of amorphous carbon as a filler. The sixth embodiment follows the same initial structure of the first embodiment as depicted in FIG. 1 and explained previously.

The phenol resin used was prepared by the reaction of phenol, formalin, rosin and oil and the esterification thereof with glycerol. The particle size of the carbon particles was adjusted to about 1 μm by a ball mill or the like. The ratio of filler to resin was about 60-120%. The surfaces of the a-Si layers 31, 32, 33, 34. . . were soaked in a silicon coupling agent, such as γaminopropyltriethoxysilane (tradename: TSL8331, TOSHIBA SILICONE Co., Ltd.), N-(β-aminoethyl)-γ-aminopropyltriethoxysilane (tradename: TSL8340, TOSHIBA SILICONE Co., Ltd.), γ-glycidoxypropyltriethoxysilane (tradename: TSL8350, TOSHIBA SILICONE Co., Ltd.) and the like for 1-15 minutes. Then the surfaces were dried and baked.

The viscosity of the phenol resin containing carbon particles was adjusted by use of an ethylene glycol series or diethylene glycol series solvent. Patterns of rear electrodes 41, 42, 43, 44. . . were printed with the phenol resin by the use of a screen mask of 120-180 mesh size so that one end of each rear electrode covered a part of a corresponding space between adjacent a-Si layers 31, 32, 33, 34. . . and touched an end portion of the next-cell transparent electrode 22, 23, 24. . . . Finally, the patterns were hardened at 120-180° C. for 20-60 minutes.

The results did not appear to change when graphite having a particle size of 10 μm was used as a filler and mixed with amorphous carbon such that the ratio of amorphous carbon to graphite was in the range 0.5-2.

The Seventh Embodiment

The initial fill factor of the thin film solar cell of the seventh embodiment was 0.56. The results wherein the solar cell was left in high-temperature and high-humidity conditions of 60° C. and 90%, respectively, indicated that the fill factor was reduced to 0.51 after 20-50 hours but recovered to 0.56 after 500 hours.

The seventh embodiment relates to a mixture of phenol resin, as defined in the sixth embodiment, and alkyd resin in the proportion of from 4:6 to 2:8. The alkyd resin used was prepared by adding drying oil, such as linseed oil, tung oil, soybean oil and the like, dehydrated castor oil or constituent fatty acid thereof to a series of phthalic anhydride and glycerol. Additional treatment was made in the same manner as in the sixth embodiment.

The Eight Embodiment

The initial fill factor of the solar cell of the eighth embodiment was 0.61. The test results wherein the solar cell was left in high-temperature and high-humidity conditions of 60° C. and 90%, respectively, indicated that the fill factor was reduced to 0.48 after 20-50 hours but recovered to 0.55 after 500 hours.

The solar cell of the eighth embodiment was produced in the same manner as that of the third embodiment, except that a mixture of the phenol-modified alkyd resin, as defined in the seventh embodiment, and epoxy resin was used. For example, the epoxy resin used was prepared by interacting epichlorhydrin to bisphenol A made from phenol and acetone. Amorphous carbon and graphite, in the proportion of 0.5-2, were mixed in the resin to achieve a ratio of resin to filler of 0.3-2.0. Then a silicon coupling agent, as defined in the sixth embodiment, was mixed and mulled with the resin. Then roll dispersion treatment was applied to the resin. The preferred ratio of resin to filler was determined to be 0.5-1.5.

The Ninth Embodiment

The initial fill factor of the solar cell of the ninth embodiment was 0.60. The test results wherein the solar cell was left in high-temperature and high-humidity conditions of 60° C. and 90%, respectively, indicated that the fill factor was reduced to 0.52 after 50 hours but recovered to 0.60 after 500 hours.

In the ninth embodiment, particles of ITO (indium-tin oxide), of particle size in the range of 2-15 μm, were added to a filler of amorphous carbon and graphite, as defined in the eighth embodiment, at a proportion of 20-80% per total amount of carbon and graphite. Further conditions employed, such as the mulling condition of the silane coupling agent and the condition of roll dispersion treatment, were similar to those of the eighth embodiment. The thickness of the coating film was 10-20 μm.

When the particle size of ITO was regulated at 5 to 15 μm, the fill factor improved by about 0.01. The results did not change when the solar cell array was produced in the same manner as described above except that the additive particles of ITO were replaced by particles of SnO$_2$ (tin oxide).

The aforementioned results indicate that characteristics of the solar cell can be improved by the addition of electrically conductive particles having a particle size 0.2-1.5 times the thickness of the coating film, and preferably in the range of 0.5-1.0 times as thick.

The Tenth Embodiment

The initial fill factor of the thin film solar cell of the tenth embodiment was 0.59. The results wherein the solar cell was left in high-temperature and high-humidity conditions of 60° C. and 90%, respectively, indicated that the fill factor was reduced to approximately 0.57 but recovered to 0.58 after 500 hours.

The tenth embodiment follows the initial steps of the fifth embodiment described herein, first paragraph.

Additionally, ITO or SnO$_2$ for doping was formed into a particle size of about 10 μm. A filler consisting of amorphous carbon particles, graphite particles and the doping particles in the proportions 4:6:4 was mixed in the resin so that the ratio of filler to resin became 0.5-2.0, or preferably, 1.0-1.5. Thereafter, 0.1-5% by weight of a silane coupling agent was added. After roll dispersion treatment, the resin was used for the production of printed electrodes.

The Eleventh Embodiment

The eleventh embodiment employed printed rear electrodes formed by printing two resins one over the other and subsequently burning them. One of the resins contained carbon particles mulled with a silicon coupling agent. The other resin contained nickel particles mulled with a silicon coupling agent.

Referring to FIG. 1, patterns of metal electrodes 41, 42, 43, 44... were formed by a printing method through lamination of phenol resin, containing nickel particles as a filler, and phenol resin, containing amorphous carbon particles as a filler. The phenol resin used was prepared by the reaction of phenol, formalin, rosin and oil, and the esterification thereof with glycerol. The phenol resin may be used in combination with alkyd resin so that the proportions of phenol to alkyd is from 4:6 to 2:8. The alkyd resin used was prepared by adding drying oil to a series of phthalic anhydride and glycerol. The drying oil may include linseed oil, tung oil, soybean oil and dehydrated castor oil or constituent fatty acid thereof.

The particle size of the nickel particles used was adjusted to about 5–10 μm by a ball mill or the like. The nickel particles were mixed in the phenol resin in the proportion of 1–5 parts by weight of nickel particles per one part of the resin. Further, 0.1–5% by weight of a silicon coupling agent, such as γ-aminopropyltriethoxysilane (tradename: TSL8331, TOSHIBA SILICONE Co., Ltd.) was added to the resin. The viscosity of the resulting resin was adjusted to 100–400 poise by use of an ethylene glycol series or diethylene glycol series solvent. The particle size was adjusted by roll dispersion treatment in which the resin was passed between rolls. The resin was applied to form a 10–20 μm thick film by use of a screen mask of 180–250 mesh size. Then, the film was hardened at 120–180° C. for 20–60 minutes.

The initial fill factor of the solar cell of the eleventh embodiment was 0.61. The test results wherein the solar cell was left in the high-temperature and high-humidity conditions of 60° C. and 90%, respectively, indicated that the fill factor was reduced to 0.60 after 500 hours or in other words the fill factor was lowered by about 2% after 500 hours. The particles size of Ni after the roll dispersion was 3 to 20 μm.

Epoxy resin was mixed with the phenol-modified alkyd resin as defined above to prepare a mixed resin. Amorphous carbon and graphite, in the proportion of 0.5–2, were mixed in the resin to produce a ratio of resin to filler of 0.3–2.0, or preferably, 0.5–1.5. Particles of ITO or $SnO_2$, of particle size of about 5–10 μm, were added to the resin in a proportion of 20–80% per the total amount of amorphous carbon and graphite. Thereafter, 0.1–5% by weight of a silicon coupling agent was added. After roll dispersion treatment, the resin was printed on the film containing Ni as a filler and was baked at 120–180° C. for 20–60 minutes.

As a result, the thin film solar cell produced had the initial characteristics as shown in FIG. 2 by curve 30. The initial fill factor of the thin film solar cell was 0.66 in 200 lx and was 0.63 in 100 mW/cm². The initial fill factor was little changed under high-temperature and high-humidity conditions of 60° C. and 90%, respectively. The fill factor values after 500 hours were 0.65 and 0.61.

As a comparative example, the resin containing Ni as a filler was printed but was not baked to form a first resin layer. After the first resin layer was left at room temperature for 10–30 minutes, a second resin layer containing carbon as a filler was printed and baked. The fill factor of the solar cell produced was slightly improved. The initial fill factor was 0.67 in 200 lx and was 0.65 in 100 mW/cm².

the Twelfth Embodiment

The fill factor of the solar cell of the twelfth embodiment was 0.65 in 200 lx and was 0.61 in 100 mW/cm². The initial factor barely changed under high-temperature and high-humidity conditions of 60° C. and 90%, respectively. The values of the fill factor after 500 hours remained constant.

The twelfth embodiment employs the second resin layer of the eleventh embodiment formed of melamine-alkyd resin. The melamine-alkyd resin may be prepared as follows. A mixture of 4–6 moles of formaldehyde and butanol were added to 1 mole of melamine. While the pH value of the resulting mixture was adjusted to 6–8 by addition of ammonia, a methylolizing reaction was conducted at 90–100° C. for 30 minutes. A small quantity of butyl phosphate was added to undergo a butyletherification reaction for about an hour while the pH values were adjusted to 4–5. The xylol was added to removed generated water and butanol. The product was diluted with a solvent selected from xylol, butanol and the mixture thereof to prepare a melamine resin solution. Thereafter, 30–40% of short-oil-length alkyd resin was mixed with the melamine resin. The short-oil-length alkyd resin was prepared by adding drying oil, such as linseed oil, tung oil, soybean oil and the like, dehydrated castor oil or constituent fatty acid to a series of phthalic anhydride and glycerol. The ratio of melamine to alkyd was from 20:80 to 45:35. Particles of ITO or $SnO_2$, of particle size of about 5–10 μm, were added to the resin in the proportion of 20–80% per the total amount of amorphous carbon and graphite. Thereafter, 0.1–5% by weight of a silicon coupling agent was added. After roll dispersion treatment, the resin was applied to form a second resin layer.

The Thirteenth Embodiment

In the thirteenth embodiment, a solar cell was prepared in the same manner as in the eleventh embodiment, except that fine powder of ITO or $SnO_2$ with a particle size of 5–10 μm was added to the resin of the first resin layer in the proportion of 20–60% per the amount of Ni filler. As a result, the fill factor of the solar cell was 0.67 in 100 mW/cm².

Other embodiments of the present invention will be apparent to those skilled in the art from consideration of the specification and practice of the disclosed invention. It is intended that the specification and examples be considered as exemplary only, with the true scope and spirit of the invention being represented by the following claims

What is claimed is:

1. A method of producing a thin film solar cell, comprising the steps of:
    forming a transparent electrically conductive film on a transparent insulating substrate;
    forming said transparent electrically conductive film into a pattern of transparent electrodes;
    forming an a-Si layer having a p-i-n junction structure on said transparent insulating substrate through said transparent electrodes;
    coating and hardening a plurality of metal electrode patterns on said a-Si layer by a printing method; and
    focussing and applying a laser light beam on the overlapping portions where said metal electrodes overlap with said transparent electrodes thereby to remove said a-Si layer at the lower portions of spaces between said metal electrode patterns and to crystallize said a-Si layer at said overlapping portions, which contact the removed portions.

2. The method of forming a thin film solar cell having increased durability to high temperatures and high humidity, of claim 10, including the steps of:

placing a layer of a transparent electrically conductive film on a glass substrate;

forming transparent electrodes with a beam of a YAG laser light having a wavelength of about 1.06 μm and a spot diameter of 60 μm;

applying an approximately 1 μm thick amorphous silicon layer having a p-i-n junction structure by plasma CVD; and, applying and hardening metal electrode patterns by printing.

* * * * *